United States Patent
Myers et al.

(10) Patent No.: US 8,373,503 B1
(45) Date of Patent: Feb. 12, 2013

(54) THIRD ORDER INTERMODULATION CANCELLATION FOR RF TRANSCONDUCTORS

(75) Inventors: John P. Myers, Fremont, CA (US); Petrus M. Stroet, Santa Cruz, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 13/323,753

(22) Filed: Dec. 12, 2011

(51) Int. Cl.
   *H03F 1/26* (2006.01)
(52) U.S. Cl. ........................... 330/149; 330/252
(58) Field of Classification Search .................. 330/149, 330/252
   See application file for complete search history.

(56) References Cited

U.S. PATENT DOCUMENTS

| | | | |
|---|---|---|---|
| 7,076,226 B2 * | 7/2006 | Bult et al. | 455/252.1 |
| 7,088,980 B2 * | 8/2006 | Otaka | 455/323 |
| 7,696,828 B2 * | 4/2010 | Chang | 330/311 |
| 7,710,185 B2 | 5/2010 | Manku | |
| 7,936,220 B2 * | 5/2011 | Li et al. | 330/311 |
| 7,944,298 B2 * | 5/2011 | Cabanillas et al. | 330/253 |
| 8,035,447 B2 * | 10/2011 | Liu et al. | 330/149 |
| 8,131,245 B2 * | 3/2012 | Christoffers et al. | 455/293 |

* cited by examiner

*Primary Examiner* — Patricia Nguyen
(74) *Attorney, Agent, or Firm* — Patent Law Group LLP; Brian D. Ogonowsky

(57) ABSTRACT

A mixer in an RF demodulator includes a transconductance amplifier that converts an RF input voltage (Vin), applied to the base of a first bipolar transistor, to a first output current. The first output current contains third order intermodulation (IM3) products. An IM3 canceller is connected in parallel with the transconductance amplifier. The base of a second bipolar transistor in the IM3 canceller is coupled to the DC component of Vin, and the AC component of Vin is coupled to the emitter of the second bipolar transistor, such that the currents though the first bipolar transistor and the currents through the second bipolar transistor change oppositely. The collectors of the transistors are coupled together. The values of components in the IM3 canceller are set so that the current generated by the IM3 canceller substantially cancels IM3 distortion in the first current or other current generated in a demodulator of Vin.

20 Claims, 4 Drawing Sheets

THIRD ORDER INTERMODULATION CANCELLATION FOR RF TRANSCONDUCTORS

FIELD OF THE INVENTION

This invention relates to a cancellation circuit for third order intermodulation (IM3) products in an RF transconductor, such as used in mixers or amplifiers in wireless receivers.

BACKGROUND

A transconductor may be a transconductance amplifier that generates a change in output current with a change in input voltage. An actual transconductance amplifier, such as in a mixer of an RF receiver, produces some distortion, such as generating second and third harmonics of the fundamental frequency, generating frequency-mixed signals, and generating intermodulation products. For example, a typical transconductance amplifier receiving sine waves $f_1$ and $f_2$ will output the following signals, having various magnitudes. The second and third order signals are output due to distortion:

| TERM | OUTPUT | FREQUENCY |
| --- | --- | --- |
| linear | fundamental | $f_1, f_2$ |
| $2^{nd}$ order | $2^{nd}$ harmonic | $2f_1, 2f_2$ |
| $3^{rd}$ order | $3^{rd}$ harmonic | $3f_1, 3f_2$ |
| $2^{nd}$ order | frequency mixing | $(f_2 - f_1), (f_2 + f_1)$ |
| $3^{rd}$ order | $3^{rd}$ order intermod. products | $(2f_2 - f_1), (2f_1 - f_2)$ |

Second and third order signals may also be generated by RF interference.

The output current of a non-ideal transconductance amplifier can be described by the following power series, limited to the third order, where transconductance (represented by the coefficient $a_n$) is defined as the change in output current ($i(t)$) with a change in input voltage ($v(t)$):

$$i(t) = a_0 + a_1 v(t) + a_2 v(t)^2 + a_3 v(t)^3 + \ldots, \qquad \text{Eq.1}$$

where the dc quiescent current is represented by $a_0$, the linear transconductance is represented by $a_1$, the second-order non-linearity is represented by $a_2$, and the third-order non-linearity is represented by $a_3$. The third order intermodulation (IM3) products are $a_3 v(t)^3$. Transconductance is also referred to herein as $g_m$.

The IM3 products are the most problematic in some situations since they may occur near a fundamental frequency and may be difficult to filter out.

Transconductance amplifiers are typically used in mixers forming part of a demodulator of an RF receiver.

There are many types of prior art IM3 cancellers. Some predistort the input voltage to compensate for the IM3 distortion. Some require differential signals to generate an IM3 correction. RF signals in the gigahertz range may be difficult to accurately convert to differential signals and may require transformers that add expense and real estate. Various drawbacks exist with the prior art IM3 cancellers, including imprecision due to process and temperature variations, the difficulty in creating differential signals at high frequencies due to component limitations, complexity, real estate requirements, and other issues.

What is needed is a simpler IM3 canceller that can operate at high frequencies, such as at gigahertz frequencies for cell phones, and is self-adjusting for process and temperature variations.

SUMMARY

An IM3 cancellation circuit is formed in parallel with a transconductance amplifier. The amplifier may be part of a mixer in a wireless RF receiver or other component in an RF receiver.

The transconductance amplifier may comprise a first NPN bipolar transistor having its base directly coupled to an RF input voltage (Vin), such as a modulated RF signal received by a cellular telephone. The emitter may be coupled to ground via a first resistor R1.

In one embodiment, Vin is generated by high-pass filtering an incoming RF signal and combining the filtered AC signal with a separately generated DC bias voltage for setting the quiescent current of transistor Q1.

The IM3 cancellation circuit comprises a second NPN bipolar transistor having its base coupled to the DC component of Vin (a DC bias voltage). Accordingly, the base voltage is relatively stable. Its emitter is coupled to ground via a second resistor R2. The emitter is also coupled to Vin via an AC coupling capacitor C1 (blocks DC) in series with a third resistor R3. Accordingly, the variable conductance of the second NPN bipolar transistor is determined by the change in its emitter voltage (corresponding to the AC component of Vin), while the variable conductance of the first NPN bipolar transistor is determined by the change in its base-emitter voltage (corresponding to the AC component of Vin). Therefore, the current through the IM3 cancellation circuit changes opposite to the current of the transconductance amplifier, and the IM3 cancellation circuit can be designed to cancel IM3 components in the combined output current or offset IM3 components generated anywhere in the receiver.

The IM3 cancellation circuit may also be designed, by proper selection of its component values, to cancel IM3 distortion generated by a demodulator containing the circuit. Such IM3 distortion may be other than any distortion generated by the transconductance amplifier or generated in combination with distortion by the transconductance amplifier.

The values of the resistors, capacitor, and areas of the transistors are calculated to offset the target IM3 products during simulation and/or calibration of the circuit.

Since the IM3 cancelling circuit is formed along with the transconductance amplifier on the same chip, the cancellation tracks variations in the transconductance amplifier due to temperature and process variations.

In one embodiment, the compensated output current is mixed with a local oscillator current to demodulate Vin to generate a baseband or intermediate frequency (IF) signal (Vout) in a receiver. The IM3 cancellation circuit is thus designed to offset any IM3 distortion (from whatever source) in the demodulated Vin signal.

Various other embodiments are described. For example, the circuit may be implemented using MOSFETs instead of bipolar transistors.

BRIEF DESCRIPTION OF THE DRAWINGS

Elements that are the same or equivalent are labeled with the same numeral.

DETAILED DESCRIPTION

Figure 1:
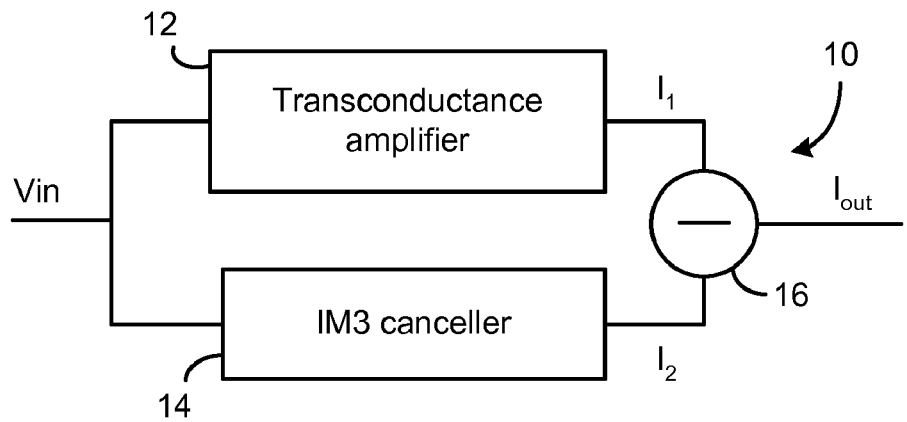
FIG. 1 is a high level diagram illustrating the transconductance amplifier and the IM3 canceller connected in parallel.

FIG. 1 illustrates one embodiment of the invention, an IM3-compensated amplifier 10, formed on a single chip. The transconductance amplifier 12 portion is conventional and may be part of a mixer in a demodulator of a wireless receiver. An IM3 canceller 14 circuit generates a current $I_2$ that substantially offsets or reduces the IM3 products of interest in the current $I_1$ generated by the amplifier 12. A subtractor 16 represents the current generated by the IM3 canceller 14 being subtracted from the current generated by the amplifier 12, although the IM3 canceller 14 itself may provide the offsetting correction to the output of the amplifier 12 without the use of a separate subtractor.

Figure 2:
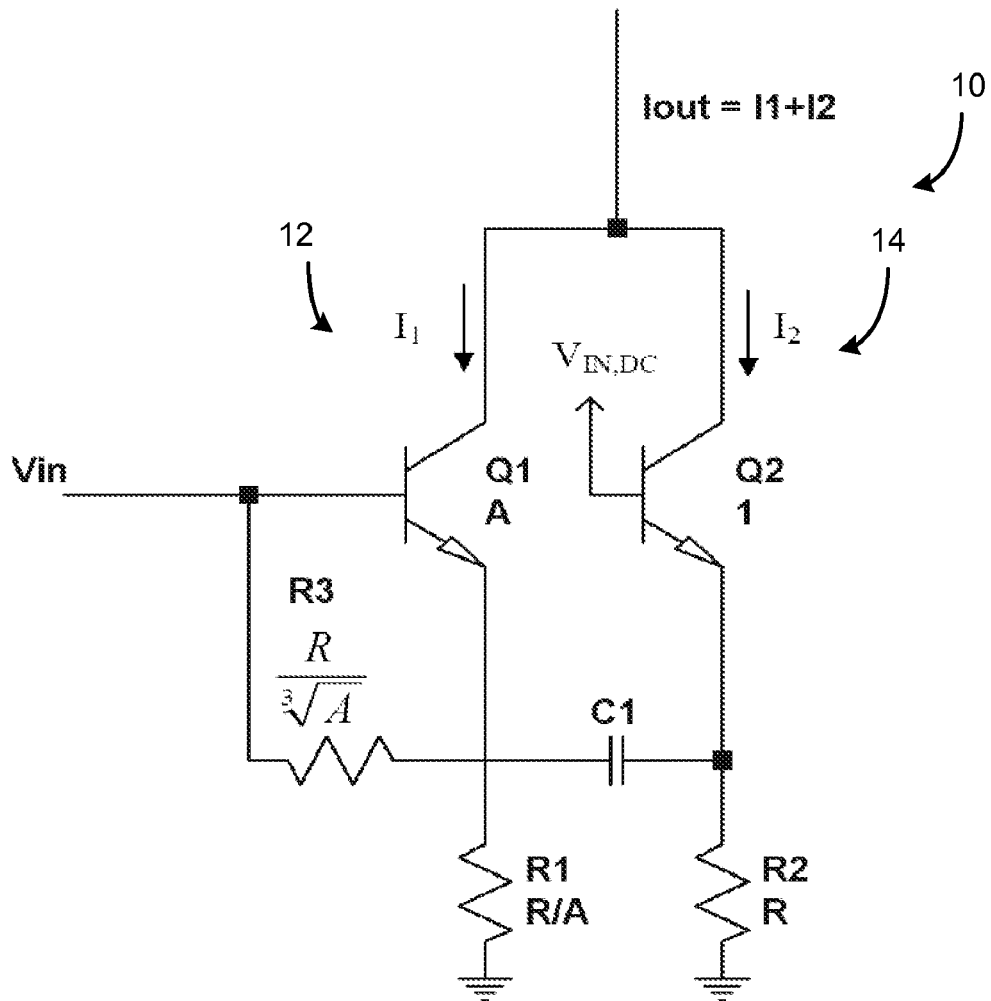
FIG. 2 is a transistor-level diagram of the transconductance amplifier and the IM3 canceller connected in parallel, in accordance with one embodiment of the invention.

FIG. 2 illustrates an embodiment of the circuit of FIG. 1. Various other embodiments are envisioned.

The transconductance amplifier 12 comprise a first NPN bipolar transistor Q1 having its base coupled to an RF input voltage (Vin), such as a modulated RF signal received by a cellular telephone. In one embodiment, Vin is generated by high-pass filtering an incoming RF signal (to filter out its DC component) and combining the filtered AC signal with a separately generated DC bias voltage for setting the quiescent current of transistor Q1. In this manner, the bias voltage can be optimized.

The emitter area is given by A. It is assumed that the area A is proportional to the transconductance of the transistor for a given Vbe. The emitter may be coupled to ground via a first resistor R1. The current $I_1$ is assumed to contain IM3 distortion.

The IM3 cancellation circuit 14 comprises a second NPN bipolar transistor Q2 having its base coupled to the DC component of Vin (the DC bias voltage). Accordingly, the base voltage of transistor Q2 is relatively stable. Its emitter is coupled to ground via a second resistor R2. The emitter is also coupled to Vin via an AC coupling capacitor C1 (blocks DC) in series with a third resistor R3. Accordingly, the variable conductance of the second NPN bipolar transistor Q2 is determined by the change in its emitter voltage (corresponding to the AC component of Vin). For negative-going Vin signals, the second NPN bipolar transistor Q2 conducts more current and, for positive-going Vin signals, the second NPN bipolar transistor Q2 conducts less current. This is opposite to the conductance of the first NPN bipolar transistor Q1. Therefore, the conductance of the IM3 cancellation circuit 14 is 180 degrees out of phase with the conductance of the transconductance amplifier 12, enabling the cancellation (or reduction) of the IM3 components in the combined output current $I_1+I_2$ (the compensated current) or enabling the cancellation of the IM3 components anywhere in the receiver.

Assume the value of resistor R2 is R, the emitter area of the transistor Q2 is 1, the emitter area of the transistor Q1 is A, and the value of resistor R1 is approximately R/A. Given the same voltage difference between the base and emitters of the two transistors, the ratio of the current through transistor Q1 to the current through transistor Q2 will be approximately the ratio of their respective areas, in this case A/1. The relative values of the resistors R1 and R2 equalize the change in emitter voltage for both transistors with changes in current through the respective transistors even though the area A of transistor Q1 may be many times greater than the area of transistor Q2. In this way, the current densities through transistors Q1 and Q2 are approximately equal, which allows tracking the input power over a large range. The area of transistor Q1 should be much greater than the area of transistor Q2 in order to maintain high transconductance (see Eq. 11) and improve noise performance. The value of resistor R3 is approximately $R/\sqrt[3]{A}$.

Capacitor C1 and resistors R2 and R3 form a high pass filter, whose cut-off frequency must be significantly below the IM3 frequency of interest in order for the circuit to accurately cancel the IM3 products. The values of the various components are determined during simulation and calibration, where, during simulation, a two-tone input is applied to the circuit and the IM3 products to be cancelled are calculated. The values of the various components are then adjusted during simulation or during fabrication to cancel out the calculated or measured IM3 products of interest. The two tones may represent the RF carrier and an LO leakage frequency, or may represent RF interference from any external source, or may represent other tones generated in the system.

In this way, the IM3 canceller 14 offsets the target IM3 distortion current generated by the transconductance amplifier 12 or by any other source. If the IM3 distortion is generated during a mixing process, where the RF compensated current is mixed with a local oscillator current to demodulate Vin, the components in the IM3 canceller 14 can be selected to compensate for the downstream IM3 distortion by the mixer. The selection of component values may correct for any IM3 distortion occurring anywhere in the receiver.

Since the IM3 canceller 14 is formed along with the transconductance amplifier 12 on the same chip, the cancellation tracks variations in the transconductance amplifier 12 due to temperature and process variations.

More detail regarding calculation of the IM3 products follow.

A two-tone input voltage signal can be represented by:

$$v(t)=\cos(\omega_1 t)+\cos(\omega_2 t) \qquad \text{Eq.2}$$

The transconductor output current in Eq.1 can then be written as:

$$i(t) = \left(a_1 + \frac{9a_3}{4}\right)[\cos(\omega_1 t) + \cos(\omega_2 t)] + \\ \frac{3a_3}{4}[\cos((2\omega_2 - \omega_1)t) + \cos((2\omega_1 - \omega_2)t)] + DC, \qquad \text{Eq. 3}$$

Second-Order, and Higher-Order Terms ...

Second-Order, and Higher-Order Terms . . . Eq. 3

The IM3 products are found at angular frequencies of $2\omega_2-\omega_1$ and $2\omega_1-\omega_2$. Assuming $a_3 \ll a_1$, the ratio of the coefficient of the linear product to the coefficient of the IM3 products can be used as a linearity figure of merit or the third-order intercept point, IP3:

$$IP3 = \frac{4a_1}{3a_3} \qquad \text{Eq. 4}$$

Figure 3:
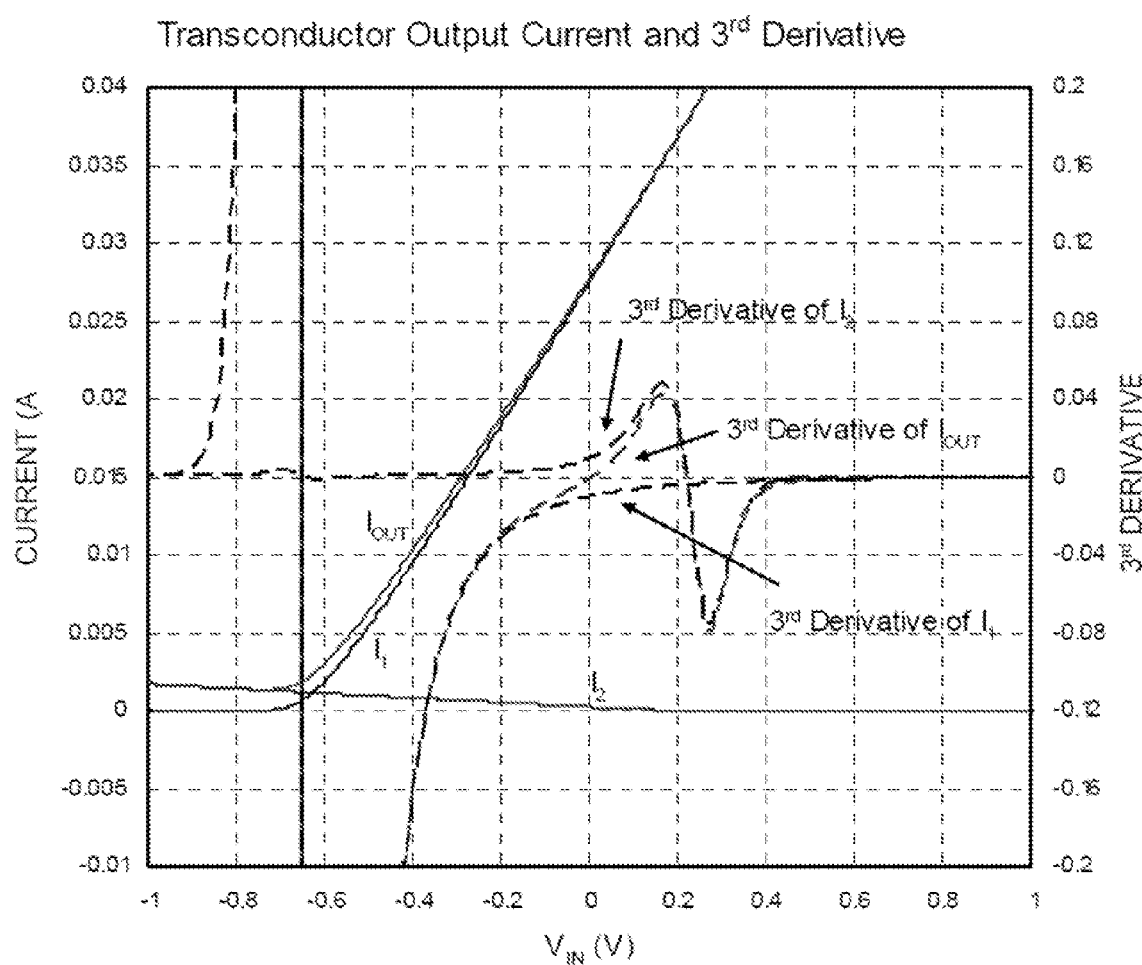
FIG. 3 illustrates the derivation of the IM3 products for a particular output current during calibration of the circuit of FIG. 2 in order to set the values of components needed to cancel out the target IM3 products.

To maximize the IP3, it is clear from Eq.4 that the coefficient $a_3$ must be minimized or made equal to zero. In order to isolate the coefficient $a_3$, the $3^{rd}$ derivative of the output current can be taken. FIG. 3 shows the output current ($I_2$) of the IM3 canceller 14, the output current ($I_1$) of the transconductance amplifier 12, the total output current ($I_{OUT}$), and the $3^{rd}$ derivatives of $I_1$, $I_2$, and $I_{OUT}$, using values given in FIG. 4.

By inspection, it can be seen that, for signal amplitudes less than about 0.15V, $I_{OUT}$ has a minimal IM3 coefficient. Also, for this signal amplitude range, the IM3 coefficient for a positive-going signal approximately cancels the IM3 coefficient for a negative-going signal.

Referring to FIG. 2, in all cases, the AC voltages at R1 and R3 are approximately equal, assuming the AC frequency is well above the cut-off frequency of the capacitor-resistor filter.

For the case of A=1, R3=R and R1=R and if R>>1/$g_{mQ2}$, we can write the two output currents $I_1$ and $I_2$, considering just the linear and $3^{rd}$ order terms, as:

$$I_1 = \frac{v_{IN} + a_3 v_{IN}^3}{R} \text{ and } I_2 = \frac{-v_{IN} - a_3 v_{IN}^3}{R} \qquad \text{Eq. 5, 6}$$

Then, the IM3-affected output $I_{OUT}=I_1+I_2=0$. Note that $a_3$ in Eq.5 and Eq.6 are substantially equal since both $Q_1$ and $Q_2$ run at the same current densities, due to the relationship of R1 and R2 to the respective areas of the transistors Q1 and Q2.

For the case of A>1, R3=R, and if R>>1/$g_{mQ2}$, the currents can be written:

$$I_1 = \frac{Av_{IN} + Aa_3 v_{IN}^3}{R} \text{ and } I_2 = \frac{-v_{IN} - a_3 v_{IN}^3}{R} \qquad \text{Eq. 7, 8}$$

Then, $$I_{OUT} = I_1 + I_2 = \left(\frac{A-1}{R}\right)(v_{IN} + a_3 v_{IN}^3),$$

and the third-order term is still undesirably present.

If, in the desired case, A>1, R>>1/$g_{mQ2}$, and R3=R/$\sqrt[3]{A}$, the currents can be written:

$$I_1 = \frac{Av_{IN} + Aa_3 v_{IN}^3}{R} \text{ and} \qquad \text{Eq. 9, 10}$$

$$I_2 = \frac{-\sqrt[3]{A}\, v_{IN} - a_3 (\sqrt[3]{A}\, v_{IN})^3}{R} = \frac{-\sqrt[3]{A}\, v_{IN} - Aa_3 v_{IN}^3}{R}$$

Then, the $3^{rd}$-order terms desirably cancel and the output current can be written:

$$I_{OUT} = I_1 + I_2 = \left(\frac{A - \sqrt[3]{A}}{R}\right)v_{IN} \qquad \text{Eq. 11}$$

Accordingly, the relationships of the values of the components in the circuit of FIG. 2 needed to completely cancel the IM3 products of interest have been shown. Note that the signal voltage at the emitter of transistor Q2 is multiplied by approximately $\sqrt[3]{\sqrt{A}}$ because the value of resistor R3 is $\sqrt[3]{\sqrt{A}}$ smaller than the value of resistor R, while using the same bias current. In practice, the value of resistor R3 is normally chosen somewhat higher than R/$\sqrt[3]{\sqrt{A}}$ to get optimum cancellation for a typical fine-line bipolar process. Depending on process parasitics, including the high-frequency AC device parasitics of the transistors used such as the base-emitter capacitance (or gate-source capacitance), base-collector capacitance (or gate-drain capacitance), parasitic device resistances, the optimum value for resistor R3 will typically be in the range of R/10 to R. Detailed simulation of the circuit performance including parasitics is usually necessary to arrive at the optimum value for resistor R3.

Figure 4:
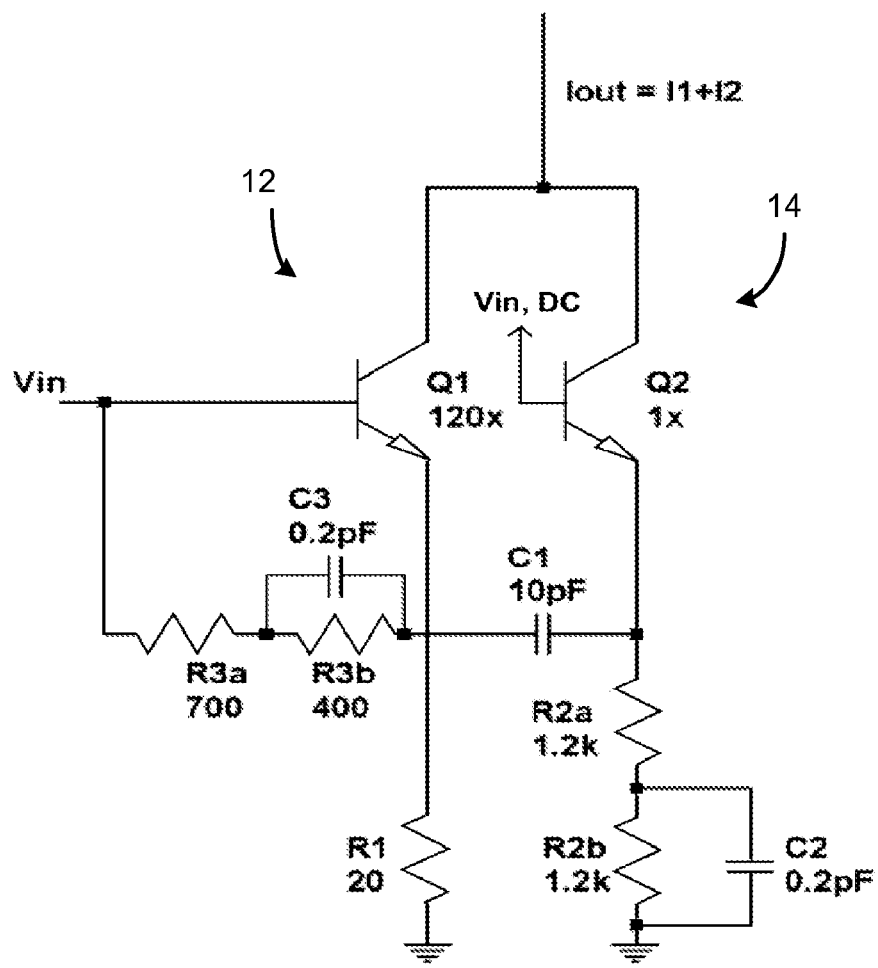
FIG. 4 illustrates a variation of the circuit of FIG. 2 that enables the circuit to have a wider bandwidth for accurate operation.

When the circuit of FIG. 2 is operated at above certain high frequencies, the gain of the "smaller" transistor Q2 lowers more than the gain of the "bigger" transistor Q1, since some AC device parasitics scale less than A if transistor Q1 is optimized for high frequencies. Accordingly, better cancellation of IM3 products can be obtained over a larger bandwidth by using some bypass capacitors across the resistor R3 and the resistor R2. This increases the responsiveness of the IM3 canceller 14. FIG. 4 shows a specific implementation with such compensation applied to the circuit in FIG. 2. Resistor R3 and resistor R2 are split into R3a, R3b, R2a, and R2b, respectively, and a portion of the resistance has a high frequency bypass path through capacitors C2 and C3 to lower the effective impedances at high frequencies. Capacitor C1 provides the AC coupling, assuming the Vin frequencies of interest are much higher than the cut-off frequency provided by the resulting capacitor-resistor high pass filter. Examples of values of the resistors (in ohms), values of capacitors, and relative areas of the transistors are given.

Other embodiments are envisioned, such as an all MOSFET circuit. In a MOSFET implementation of FIG. 2, Vin would be applied to the gate of a first n-channel MOSFET in a transconductance amplifier, and the DC component of Vin would be applied to the gate of a second n-channel MOSFET. The AC component of Vin would be applied to the source of the second MOSFET so that the IM3 canceller generates an IM3 current that is opposite to the IM3 distortion generated by the transconductance amplifier (the IM3 compensation may also compensate for other distortions). The respective areas (A) would then refer to the gate widths of the MOSFETs.

Figure 5:
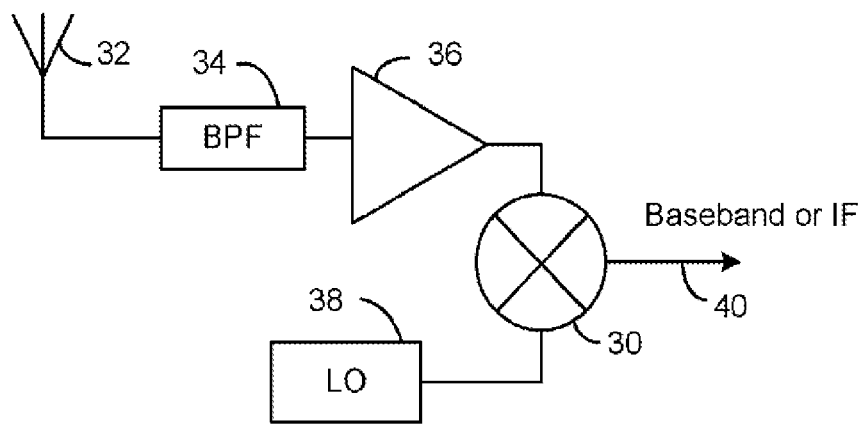
FIG. 5 illustrates the invention as part of a mixer in a wireless receiver, such as a cell phone.

FIG. 5 illustrates the inventive circuit incorporated in a mixer 30 of a demodulator in an RF receiver, such as a cellular telephone. An antenna 32 receives the RF signal. A bandpass filter 34 passes the frequency of interest to a low noise amplifier 36. The mixer 30 mixes the RF signal with a local oscillator (LO) 38 signal to generate a down-converted signal 40 at the output. The signal 40 may be baseband or an intermediate frequency (IF). All components, except the antenna 32, may be formed on the same chip.

Figure 6:
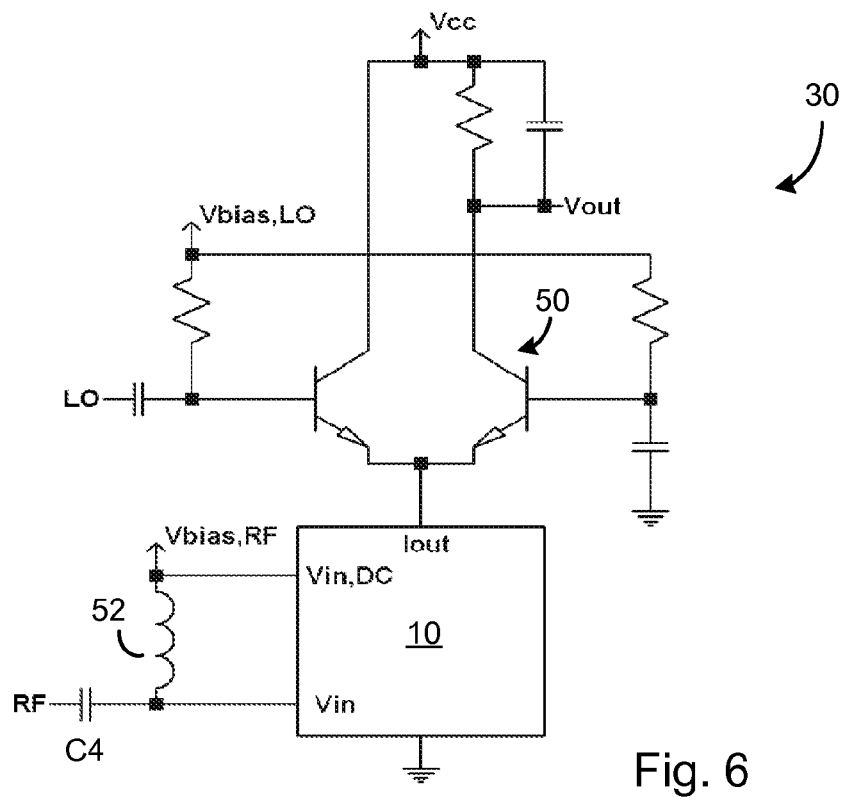
FIG. 6 illustrates the mixer of FIG. 5 in more detail, showing the IM3-compensated amplifier as the "tail" current source for the mixer.

FIG. 6 illustrates the mixer 30 of FIG. 5 in more detail, showing the IM3-compensated amplifier 10 as the "tail" current source for the mixer 30. Vout is the demodulated output of the mixer 30. A DC bias voltage Vbias,LO is generated for biasing the differential pair of transistors 50 at an optimal quiescent current. In one embodiment, Vbias,LO is 3 volts.

An incoming RF signal is high-pass filtered by capacitor C4, and a separate DC bias voltage Vbias,RF is generated for DC biasing the transistor Q1 (FIG. 2). An inductor 52 couples Vbias,RF to the base of transistor Q1. The voltages are combined to generate Vin for applying to the base of transistor Q1 (FIG. 2). In one embodiment, Vbias,RF is 1.5 volts. The Vbias(RF) is also applied to the base of transistor Q2 (FIG. 2). The compensated current Iout compensates for IM3 distortion generated during the mixing of the RF and LO signals. The circuit may be designed to compensate for IM3 distortion caused at any stage in the receiver or due to RF interference.

Figure 7:
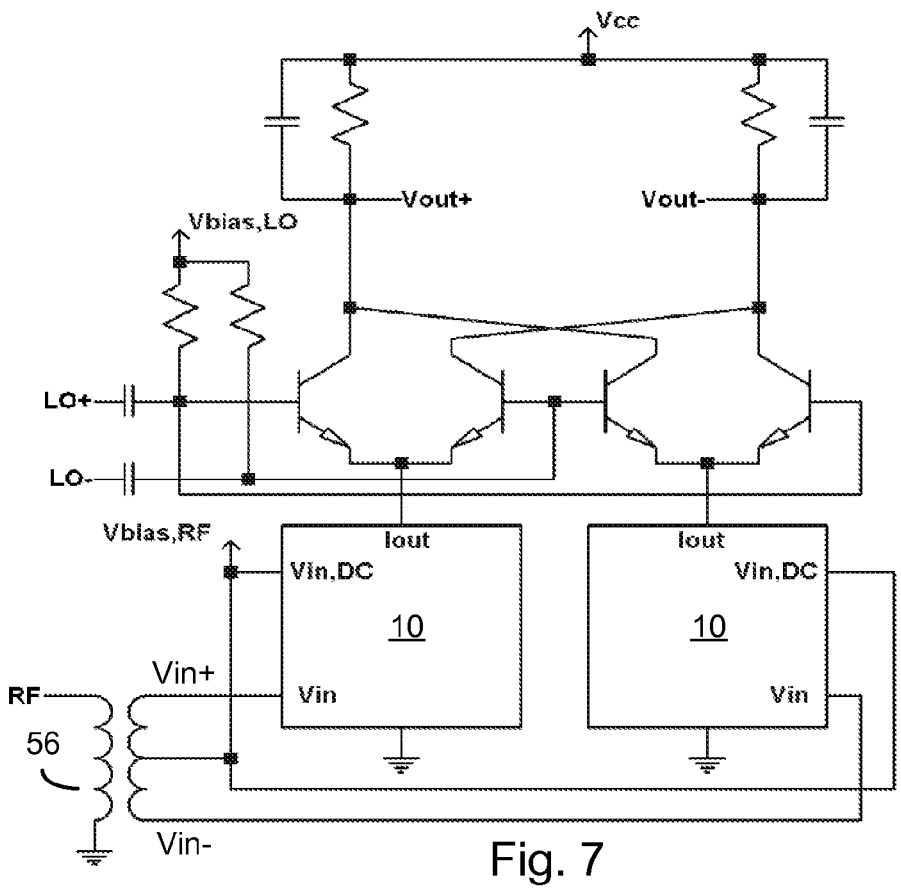
FIG. 7 illustrates a doubly-balanced mixer implementation.

FIG. 7 illustrates a doubly-balanced mixer implementation, showing the IM3-compensated amplifier 10 as the "tail" current source for each side of the mixer. Vout+ and Vout− are the balanced outputs of the mixer. Vin+ and Vin− are generated using a balun transformer 56 with a center-tap for the Vin,DC bias.

Although the term "IM3 canceller" has been used herein, the cancellation will typically not be perfect due to the actual circuit differing from simulation, due to the attenuation vs. frequency effects of the filter, and due to other real-world limitations. Accordingly, an actual IM3 canceller 14 will substantially offset (rather than perfectly cancel) the IM3 distortion output by the transconductance amplifier 12. In practical real-world implementations, the actual circuit can improve the IP3 by up to 5 to 10 dB.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A circuit that reduces third-order intermodulation (IM3) product distortion, the circuit comprising:
a transconductance amplifier comprising a first transistor configured to conduct a first current related to a voltage difference between a first terminal and a second terminal of the first transistor, the first terminal being coupled to receive an RF input voltage (Vin) having a DC component and an AC component, the first transistor also having third terminal for conducting the first current controlled by Vin; and
an IM3 canceller circuit comprising a second transistor configured to conduct a second current related to a voltage difference between a fourth terminal and a fifth terminal of the second transistor, the fourth terminal being coupled to substantially receive only the DC component of Vin, the fifth terminal coupled to substantially receive only the AC component of Vin, the second transistor also having a sixth terminal for conducting the second current controlled by the AC component such that an increase in the first current conducted by first transistor occurs during a decrease in the second current conducted by the second transistor, and vice versa,
wherein the third terminal of the first transistor is coupled to the sixth terminal of the second transistor such that the second current at least partially offsets IM3 distortion.

2. The circuit of claim 1 further comprising a capacitor coupled to filter Vin to generate the AC component.

3. The circuit of claim 1 wherein the first transistor has first size (A1) and wherein the second transistor has a smaller second size (A2), wherein a ratio of currents through the first transistor and the second transistor is approximately A1/A2 given the same voltage difference between the first terminal and the second terminal of the first transistor, and between the fourth terminal and the fifth terminal of the second transistor.

4. The circuit of claim 3 further comprising:
a first resistor, having a first value, coupled to the second terminal of the first transistor; and
a second resistor, having a second value, coupled to the fifth terminal of the second transistor, the second value being larger than the first value;
wherein the second value of the second resistor is R and the first value of the first resistor is approximately R/(A1/A2).

5. The circuit of claim 4 further comprising:
a capacitor coupled to filter Vin to generate the AC component; and
a third resistor coupled in series with the capacitor between Vin and the fifth terminal of the second transistor, the third resistor having a third value related to A1/A2 for adjusting a voltage at the fifth terminal in response to the AC component to cause the second current to at least partially offset IM3 distortion.

6. The circuit of claim 5 wherein the second resistor comprises at least two resistors in series, the circuit further comprising a bypass capacitor in parallel with one of the resistors in series.

7. The circuit of claim 5 wherein the third resistor comprises at least two resistors in series, the circuit further comprising a bypass capacitor in parallel with one of the resistors in series.

8. The circuit of claim 1 wherein the first transistor and the second transistor are bipolar transistors, wherein the first terminal is a base of the first transistor, the second terminal is an emitter of the first transistor, the third terminal is a collector of the first transistor, the fourth terminal is a base of the second transistor, the fifth terminal is an emitter of the second transistor, and the sixth terminal is a collector of the second transistor.

9. The circuit of claim 1 wherein the combined first current and second current is a current generated in a demodulator for an RF signal.

10. The circuit of claim 1 wherein the combined first current and second current is a current generated in a mixer for an RF signal.

11. The circuit of claim 1 wherein the second current at least partially offsets IM3 distortion in the first current.

12. The circuit of claim 1 wherein the second current at least partially offsets IM3 distortion generated in a demodulator containing the circuit.

13. A method of reducing third-order intermodulation (IM3) product distortion, the method comprising:
providing a transconductance amplifier comprising a first transistor configured to conduct a first current related to a voltage difference between a first terminal and a second terminal of the first transistor;
applying an RF input voltage (Vin) to the first terminal, Vin having a DC component and an AC component, the first transistor also having third terminal for conducting the first current controlled by Vin;
providing an IM3 canceller circuit comprising a second transistor configured to conduct a second current related to a voltage difference between a fourth terminal and a fifth terminal of the second transistor;
applying substantially only the DC component of Vin to the fourth terminal; and
applying substantially only the AC component of Vin to the fifth terminal, the second transistor also having a sixth terminal for conducting the second current controlled by the AC component such that an increase in the first current conducted by first transistor occurs during a decrease in the second current conducted by the second transistor, and vice versa, wherein the third terminal of the first transistor is coupled to the sixth terminal of the second transistor such that the second current at least partially offsets IM3 distortion.

14. The method of claim 13 further comprising high-pass filtering Vin by a capacitor to generate the AC component.

15. The method of claim 13 wherein the first transistor has first size (A1) and wherein the second transistor has a smaller second size (A2), wherein a ratio of currents through the first transistor and the second transistor is approximately A1/A2 given the same voltage difference between the first terminal and the second terminal of the first transistor, and between the fourth terminal and the fifth terminal of the second transistor.

16. The method of claim 15 further comprising high-pass filtering Vin by a capacitor to generate the AC component, the IM3 canceller circuit further comprising:
   a resistor coupled in series with the capacitor between Vin and the fifth terminal of the second transistor, the third resistor having a third value related to A1/A2 for adjusting a voltage at the fifth terminal in response to the AC component to cause the second current to at least partially offset IM3 distortion.

17. The method of claim 13 wherein the first transistor and the second transistor are bipolar transistors, wherein the first terminal is a base of the first transistor, the second terminal is an emitter of the first transistor, the third terminal is a collector of the first transistor, the fourth terminal is a base of the second transistor, the fifth terminal is an emitter of the second transistor, and the sixth terminal is a collector of the second transistor.

18. The method of claim 11 further comprising:
   combining the first current and second current to provide a compensated current in a demodulator for Vin; and
   mixing the compensated current with a local oscillator current to demodulate Vin.

19. The method of claim 17 wherein the second current at least partially offsets IM3 distortion in the first current.

20. The method of claim 17 wherein the second current at least partially offsets IM3 distortion generated in the demodulator.

* * * * *

UNITED STATES PATENT AND TRADEMARK OFFICE
CERTIFICATE OF CORRECTION

PATENT NO. : 8,373,503 B1  
APPLICATION NO. : 13/323753  
DATED : February 12, 2013  
INVENTOR(S) : John P. Meyers et al.

Page 1 of 1

It is certified that error appears in the above-identified patent and that said Letters Patent is hereby corrected as shown below:

In the Specifications

Column 4,

Line 14, where " $R/\sqrt[3]{\sqrt{A}}$ " should read -- $R/\sqrt[3]{A}$ --.

Column 5,

Line 50, where " $R3=R/\sqrt[3]{\sqrt{A}}$ " should read -- $R3=R/\sqrt[3]{A}$ --.

Column 6,

Line 5, where " $\sqrt[3]{\sqrt{A}}$ " should read -- $\sqrt[3]{A}$ --.

Column 6,

Line 5, where " $R3\ is\ \sqrt[3]{\sqrt{A}}$ " should read -- $R3\ is\ \sqrt[3]{A}$ --.

Column 6,

Line 8, where " $R/\sqrt[3]{\sqrt{A}}$ " should read -- $R/\sqrt[3]{A}$ --.

Signed and Sealed this  
Twenty-eighth Day of May, 2013

Teresa Stanek Rea  
*Acting Director of the United States Patent and Trademark Office*